US008290461B1

(12) United States Patent
Sankaran et al.

(10) Patent No.: US 8,290,461 B1
(45) Date of Patent: Oct. 16, 2012

(54) TRANSFERRING CONTROL OF A COMMON GAIN ELEMENT IN A WIRELESS DEVICE SUPPORTING MULTIPLE PROTOCOLS

(75) Inventors: Sundar G. Sankaran, Campbell, CA (US); Tevfik Yucek, Sunnyvale, CA (US); Paul Petrus, San Jose, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 388 days.

(21) Appl. No.: 12/767,563

(22) Filed: Apr. 26, 2010

(51) Int. Cl.
*H04B 1/06* (2006.01)
*H04B 7/00* (2006.01)
(52) U.S. Cl. ............... 455/232.1; 455/246.1; 455/552.1
(58) Field of Classification Search ............ 455/232.1, 455/234.1–235.1, 246.1, 247.1, 552.1
See application file for complete search history.

(56) References Cited

U.S. PATENT DOCUMENTS

| 6,944,427 | B2 | 9/2005 | Haub et al. | |
|---|---|---|---|---|
| 7,260,416 | B2 | 8/2007 | Shippee | |
| 7,751,850 | B2 | 7/2010 | Karaoguz | |
| 7,801,099 | B2 | 9/2010 | Desai | |
| 8,155,612 | B1 * | 4/2012 | Husted et al. | 455/234.1 |
| 2007/0155344 | A1 | 7/2007 | Wiessner et al. | |
| 2008/0139151 | A1 * | 6/2008 | Ojo et al. | 455/234.1 |
| 2008/0259846 | A1 | 10/2008 | Gonikberg et al. | |
| 2009/0239471 | A1 * | 9/2009 | Tran et al. | 455/41.2 |
| 2010/0003935 | A1 * | 1/2010 | Behzad et al. | 455/132 |
| 2011/0212696 | A1 * | 9/2011 | Hahn et al. | 455/83 |
| 2011/0249603 | A1 * | 10/2011 | Rick et al. | 370/311 |

* cited by examiner

*Primary Examiner* — Christian Hannon
(74) *Attorney, Agent, or Firm* — Bay Area Technology Law Group PC

(57) ABSTRACT

A communication device supporting multiple wireless protocols may share a common gain element in a coordinated manner. A first wireless protocol circuitry of the communication device may enter an active state, and in response to entering the active state, may determine whether a second wireless protocol circuitry of the communication device is active and whether the common gain element is currently shared. The gain element may be adjustable to amplify signals by an adjustable amount. The first wireless protocol circuitry may take control of the gain element from the second wireless protocol circuitry in response to determining that the second wireless protocol circuitry is active and the gain element is currently shared.

20 Claims, 8 Drawing Sheets

TRANSFERRING CONTROL OF A COMMON GAIN ELEMENT IN A WIRELESS DEVICE SUPPORTING MULTIPLE PROTOCOLS

BACKGROUND

1. Field of the Disclosure

The present invention relates generally to wireless communication, and more particularly to a system and method for transferring control of a common gain element in a system supporting multiple protocols for use in a wireless device.

2. Description of the Related Art

Wireless communication is being used for a plethora of applications, such as in laptops, cell phones, and other wireless communication devices ("wireless devices"). In fact, wireless communication is becoming so widely used, it is common for wireless devices to be able to communicate using a plurality of different wireless communication protocols. Accordingly, it is common for a wireless device to have different circuit portions that implement different wireless protocols.

When a wireless device receives a wireless signal on its antenna, the signal is converted to baseband and then provided (split) to the different circuit portions that implement the different wireless protocols. Sometimes, the signal is input to a splitter before it is provided to the different circuit portions. Thus only half of the original signal energy is provided to each of the different circuit portions. As a result, each of the split signals suffers a 3 dB loss in sensitivity. Alternatively, the device can use a switch to switch the signal to the different circuit portions. However, only one circuit portion may be used at a time, and the device is not able to simultaneously receive multiple signals of different wireless protocols. Therefore, improvements in wireless devices are desired.

SUMMARY OF THE DISCLOSURE

Embodiments of the disclosure relate to a communication device that can process signals according to multiple wireless protocols simultaneously and with minimal signal loss. In particular, the wireless device may implement a common gain element, e.g., a gain element which may be part of the receive path for signals according to both a first wireless protocol and a second wireless protocol. First wireless protocol circuitry (e.g., for processing signals according to the first wireless protocol) and second wireless protocol circuitry (e.g., for processing signals according to the second wireless protocol) may be able to share control of the shared gain element; for example, one or the other of the first and second wireless protocol circuitries may control the shared gain element at any given time in a non-conflicting manner. Use of the common gain element in this manner may allow the wireless device to receive signals having components according to the first wireless protocol, according to the second wireless protocol, or simultaneously according to both the first and second wireless protocols, with minimal signal loss.

Embodiments of the disclosure include a method for transferring control of a (common) gain element in a system supporting multiple wireless protocols for use in a wireless device and a system configured to implement the method. The system may include an input for receiving signals, and a gain element coupled to the input. The gain element may be adjustable to amplify the received signals by an adjustable amount. The system may further include a first wireless protocol circuitry coupled to the gain element, and a second wireless protocol circuitry also coupled to the gain element. The first wireless protocol circuitry may be configured to receive and process first signals according to a first wireless protocol. The second wireless protocol circuitry may be configured to receive and process second signals according to a second wireless protocol.

Upon entering an active state, the first wireless protocol circuitry may be configured to determine whether the second wireless protocol circuitry is active, and to determine whether the gain element is currently shared. It should be noted that although the gain element may be coupled to both the first wireless protocol circuitry and the second wireless protocol circuitry, in the context of this disclosure, the gain element may only be considered "shared" when both the first wireless protocol circuitry and second wireless protocol circuitry are using (e.g., both receiving via) paths that include the gain element. For example, if the second wireless protocol circuitry were idle or transmitting (e.g., not receiving signals via the gain element) while the first wireless protocol circuitry were receiving signals via the gain element, the gain element would not be considered "shared" at that time.

If it is determined that the second wireless protocol circuitry is active and the gain element is currently shared, the first wireless protocol circuitry may be configured to take control of the gain element from the second wireless protocol circuitry. In some embodiments, this may include sending a request for control of the gain element to the second wireless protocol circuitry. The second wireless protocol circuitry may be configured to receive such a request from the first wireless protocol circuitry, and in response, to send an acknowledgement that the first wireless protocol circuitry is taking control of the gain element from the second wireless protocol circuitry. The first wireless protocol circuitry may be configured to receive this acknowledgement. In some embodiments, the acknowledgment may include an indication of a current gain setting of the gain element. The first wireless protocol circuitry may be configured to control a gain setting of the gain element, e.g., based on the current gain setting of the gain element.

The first wireless protocol circuitry may be configured, if it determines that the second wireless protocol circuitry is inactive or the gain element is not currently shared in response to entering an active state, to take control of the gain element without notifying the second wireless protocol circuitry.

The first wireless protocol circuitry may be configured to perform a similar process upon preparing to enter an inactive state in order to transfer control of the gain element to the second wireless protocol circuitry. In some embodiments, for example, the first wireless protocol circuitry may be configured, upon preparing to enter an inactive state and in response to preparing to enter an inactive state, to determine whether the second wireless protocol circuitry is active and whether the gain element is currently shared. In this case, if it is determined that the second wireless protocol circuitry is active and the gain element is currently shared, the first wireless protocol circuitry may send a request that the second wireless protocol circuitry take control of the gain element to the second wireless protocol circuitry. In response to receiving the request, the second wireless protocol circuitry may be configured to control a gain setting of the gain element.

In some embodiments, the second wireless protocol circuitry may be configured to adjust one or more of its gain control settings in response to controlling (or no longer controlling) the gain element. In addition, the second wireless protocol circuitry may be configured to make a determination of whether to control the gain element upon (and in response to) entering an active state. For example, in this situation the second wireless protocol circuitry may be configured to determine whether the first wireless protocol circuitry and whether the gain element is currently shared. The second wireless protocol circuitry may be configured to control a gain setting of the gain element if the first wireless protocol circuitry is inactive or the gain element is not currently shared. On the other hand, the second wireless protocol circuitry may be configured to not control the gain setting of the gain element if the first wireless protocol circuitry is active and the gain element is currently shared.

BRIEF DESCRIPTION OF THE DRAWINGS

A better understanding of the present invention can be obtained when the following Detailed Description of the Embodiments is read in conjunction with the following drawings, in which.

Figure 1A:
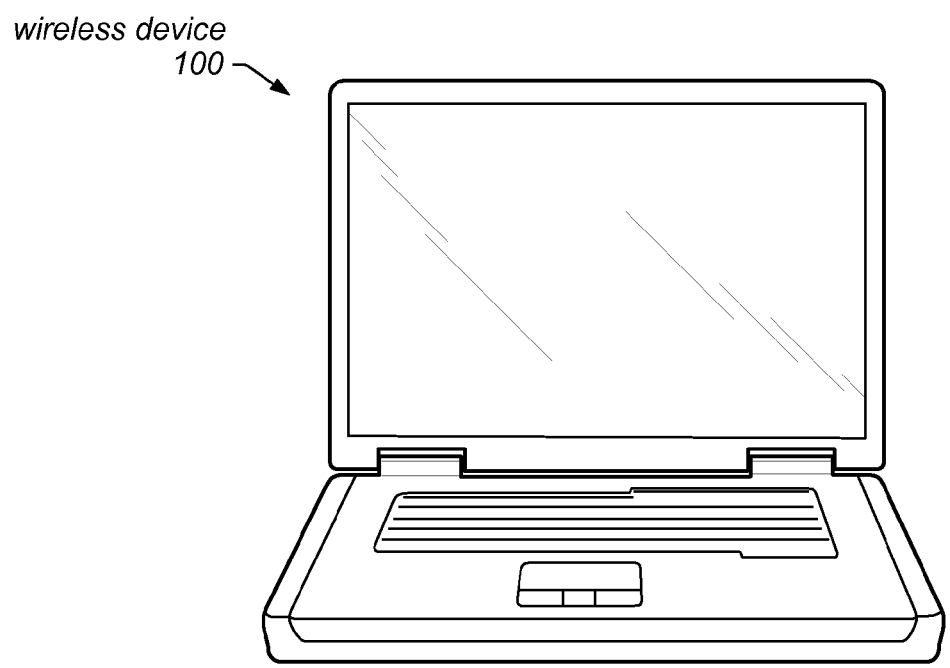
FIGS. 1A and 1B illustrates exemplary wireless devices, according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE DISCLOSURE

Incorporation by Reference

The following applications are hereby incorporated by reference in their entirety as though fully and completely set forth herein:

U.S. application Ser. No. 12/541,284, titled "Wireless Device Using A Shared Gain Stage For Simultaneous Reception Of Multiple Protocols", filed Aug. 14, 2009, whose inventor is Paul J. Husted;

U.S. application Ser. No. 12/323,338, titled "Wireless Device Using A Shared Gain Stage For Simultaneous Reception Of Multiple Protocols", filed Nov. 25, 2008, whose inventors are Paul J. Husted, Srenik Mehta, and Soner Ozgur; and U.S. provisional application Ser. No. 61/116,239, titled "Wireless Device Using A Shared Gain Stage For Simultaneous Reception Of Multiple Protocols", filed Nov. 19, 2008, whose inventors are Paul J. Husted, Srenik Mehta, and Soner Ozgur.

Figure 1B:
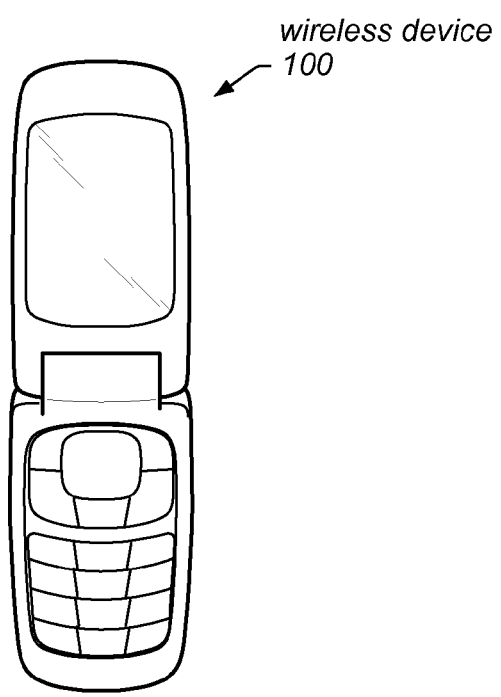

FIGS. 1A and 1B illustrate an exemplary wireless device 100, according to one embodiment. As shown in FIG. 1A, the wireless device 100 may be a portable computer or other mobile computing device. Alternatively, as shown in FIG. 1B, the wireless device 100 may be a cell phone or smart phone or other similar mobile device (which may also be classified as a mobile computing device). However, it should be noted that other wireless devices are envisioned, such as personal digital assistants, multimedia players (portable or stationary), routers, and/or other mobile devices/computing systems which are operable to use wireless communication.

The wireless device 100 may be configured to perform wireless communication using a first wireless protocol and/or a second wireless protocol. For example, the wireless device 100 may be configured to perform wireless communication using only the first wireless protocol, using only the second wireless protocol, or simultaneously using both the first and second wireless protocol. The first and second wireless protocols may be any type of wireless protocol. In some embodiments, the first wireless protocol may be a wireless local area network (WLAN) protocol. Additionally, the second wireless protocol may be a short range wireless communication protocol, such as Bluetooth. As used herein, a short range wireless protocol may refer to wireless protocols which support distances of up to 1 meter to 10 meters, or in higher powered devices, 100 meters.

Figure 2:
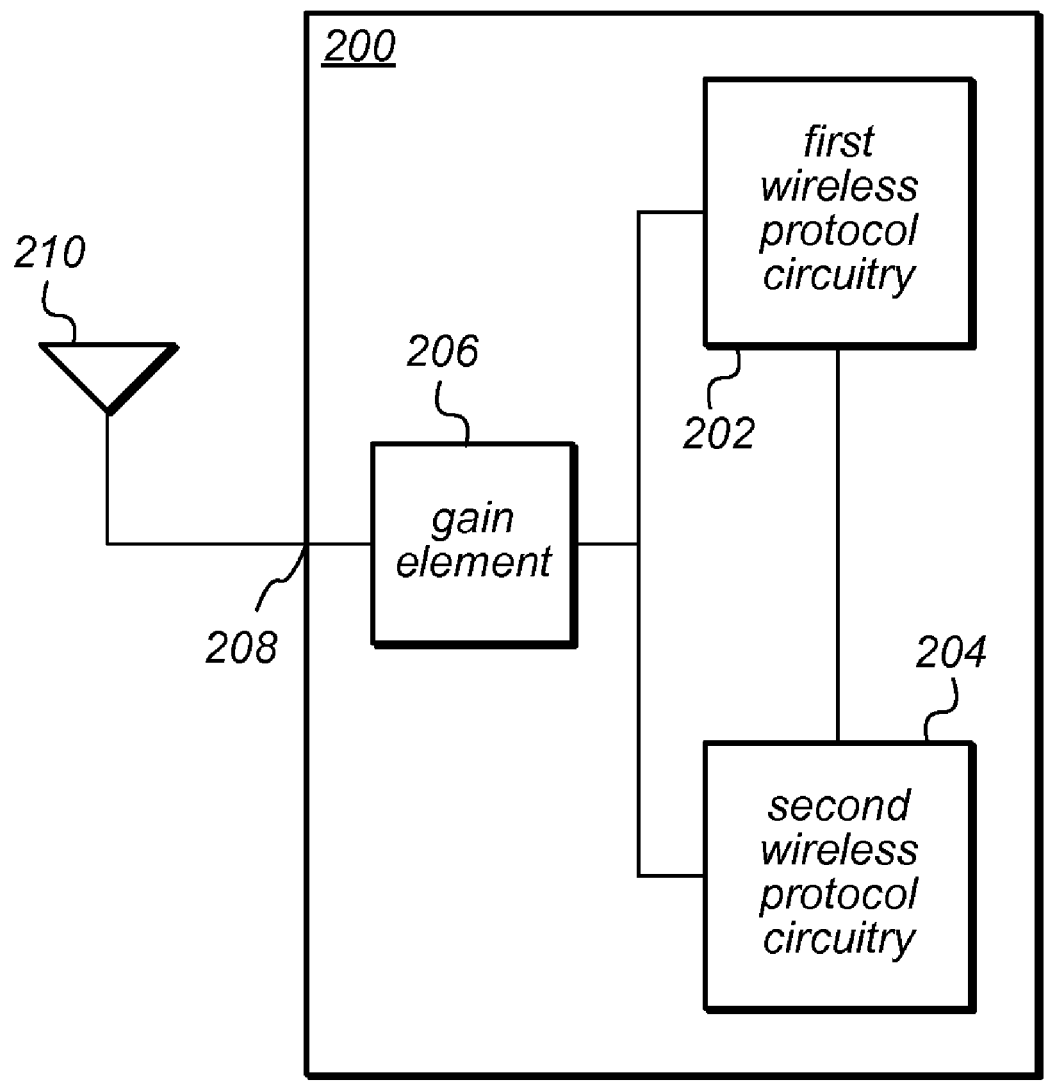
FIG. 2 is a block diagram of an exemplary system supporting multiple wireless protocols for use in a wireless device according to one embodiment.

FIG. 2 is a block diagram illustrating various components of an exemplary system 200 that supports multiple wireless protocols for use in a wireless device 100, such as any of the wireless devices shown in and described with respect to FIGS. 1A-1B. According to various embodiments, the system 200 may be integrated into the wireless device 100, or may be a discrete chip for use in a wireless device, among possible implementations. As used herein, the term "chip" has the full extent of its ordinary meaning, and includes an electronic device, e.g., a semiconductor device, that may be implemented using any of various types of logic, such as analog logic, digital logic, a processor and memory (such as a CPU, DSP, microcontroller, etc.), an ASIC (application specific integrated circuit), an FPGA (field programmable gate array), or any combination of the above.

As shown, the system 200 may include first wireless protocol circuitry 202, second wireless protocol circuitry 204, and a gain element 206 common to receive and/or transmit paths of the first and second wireless protocol circuitries. The system 200 may be configured for use in a wireless device, e.g., having at least one antenna (e.g., antenna 210) for wirelessly receiving and/or transmitting signals. Thus in some embodiments, the system 200 may include an input 208 for receiving signals, e.g., from an antenna 210 of a wireless device in which the system 200 is operating. In some embodiments, the system may include the entire wireless device, e.g., including one or more antennae. The first and second wireless protocol circuitries 202, 204 may enable the system 200 to transmit and/or receive wireless signals according to multiple wireless protocols. For example, the first wireless protocol circuitry 202 may enable reception, transmission, and processing of signals according to a first wireless protocol, and the second wireless protocol circuitry 204 may enable reception, transmission, and processing of signals according to a second wireless protocol. According to the various embodiments, the first and second wireless protocols themselves may be any type of wireless protocol, albeit proprietary, well-known standard or less well-known standard, such as, without limitation, 802.11 (WLAN), Bluetooth, ZigBee, Wireless USB, RFID, Dedicated Short Range Communications (DSRC), any combination thereof, or any other wireless protocol, as desired. As shown, the first wireless protocol circuitry 202 and the second wireless protocol circuitry 204 may be able to communicate with each other, e.g., using a communication interface.

The gain element 206 may be common to a receive path of both the first and second wireless protocol circuitries 202, 204, and may thus also be referred to as the "common gain element" 206. The common gain element 206 may also be referred to herein as Low Noise Amplifier 206 (306 in FIG. 3). The common gain element 206 may be any of various types of gain elements (such as an amplifier, gain stage, etc.) that amplifies signals, e.g., such that portions of the amplified signals are provided to each of the first and second wireless protocol circuitry 202, 204, respectively. Although the embodiments disclosed herein are primarily described in relation to implementations in which the gain element 206 is common to a receive path 208 of both the first and second wireless protocol circuitries 202, 204, it should be noted that embodiments are also contemplated in which the gain element 206 is common to a transmit path of both the first and second wireless protocol circuitries 202, 204, and/or in which both transmit paths and receive paths of the first and second wireless protocol circuitries 202, 204 include a common gain element 206.

The system 200 utilizing a common gain element 206 contrasts with some systems implementing simultaneous reception of multiple wireless protocols in which a splitter is placed before the signal is provided to the different circuit portions and before any amplification occurs. In such systems, only half of the original signal energy is provided to each of the different circuit portions. As a result, each of the split signals suffers a 3 dB loss in sensitivity. In comparison, utilizing the common gain element 206 to amplify a received signal prior to splitting the signal and providing the split signal to the first and second wireless protocol circuitries 202, 204 may avoid any significant losses. This represents a significant advantage; however, implementing a common gain element 206 may require that a method be in place for the first wireless protocol circuitry 202 and the second wireless protocol circuitry 204 to cooperatively control operation of the common gain element 206. For example, if the common gain element 206 is adjustable to amplify signals by an adjustable amount (e.g., in response to variable signal strength), the first and second wireless protocol circuitries 202, 204 may need to decide which wireless protocol circuitry should control the gain setting of the common gain element 206 at any particular time, and may need a mechanism by which the common gain element may be controlled by one or the other circuitry at any given time. The present disclosure is primarily related to embodiments of a system and method for sharing control of such a common gain element between multiple wireless protocol circuitries.

Figure 3:
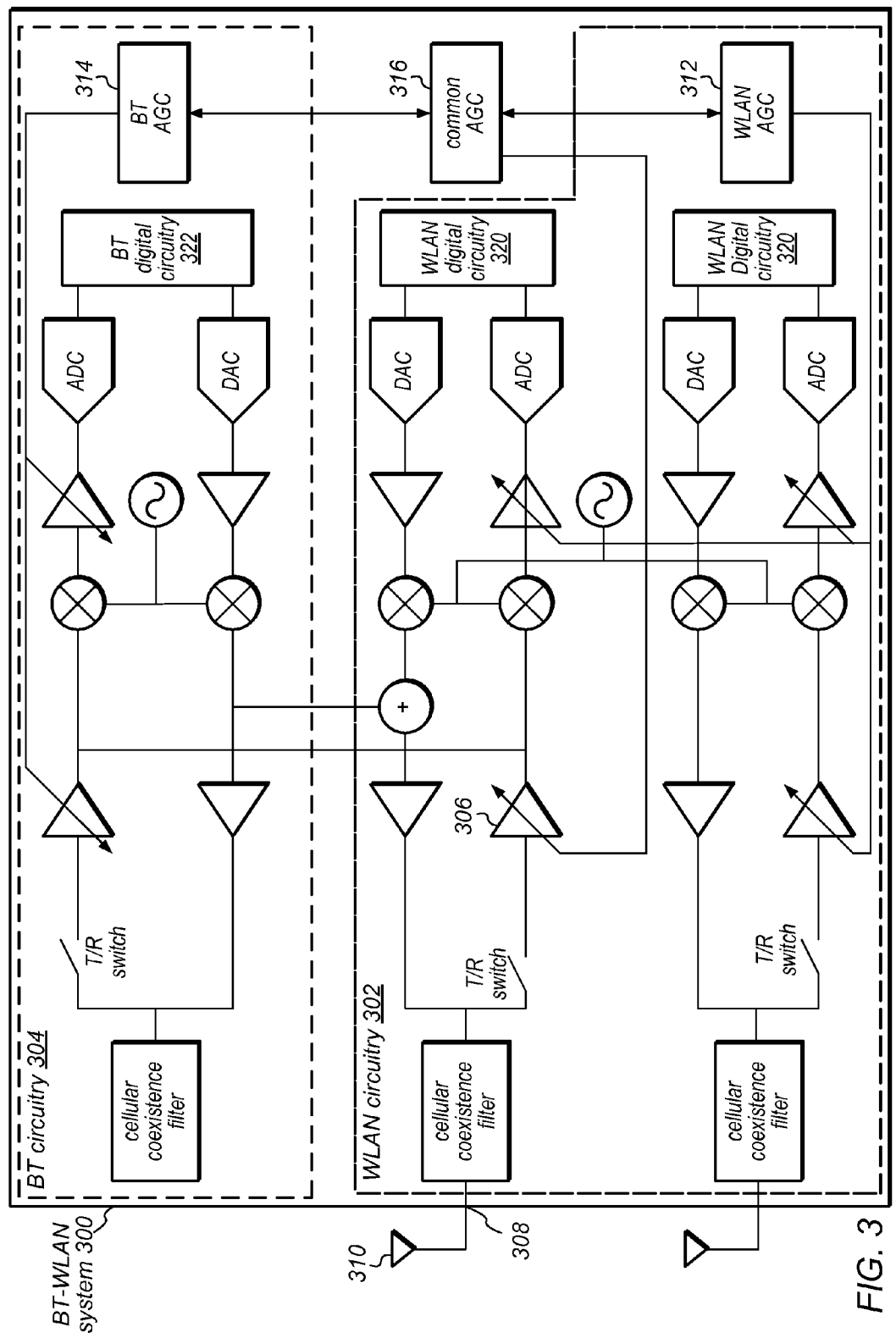
FIG. 3 is a diagram of an analog portion of a Bluetooth-WLAN implementation of a system supporting multiple wireless protocols for use in a wireless device according to one embodiment.
Figure 4:
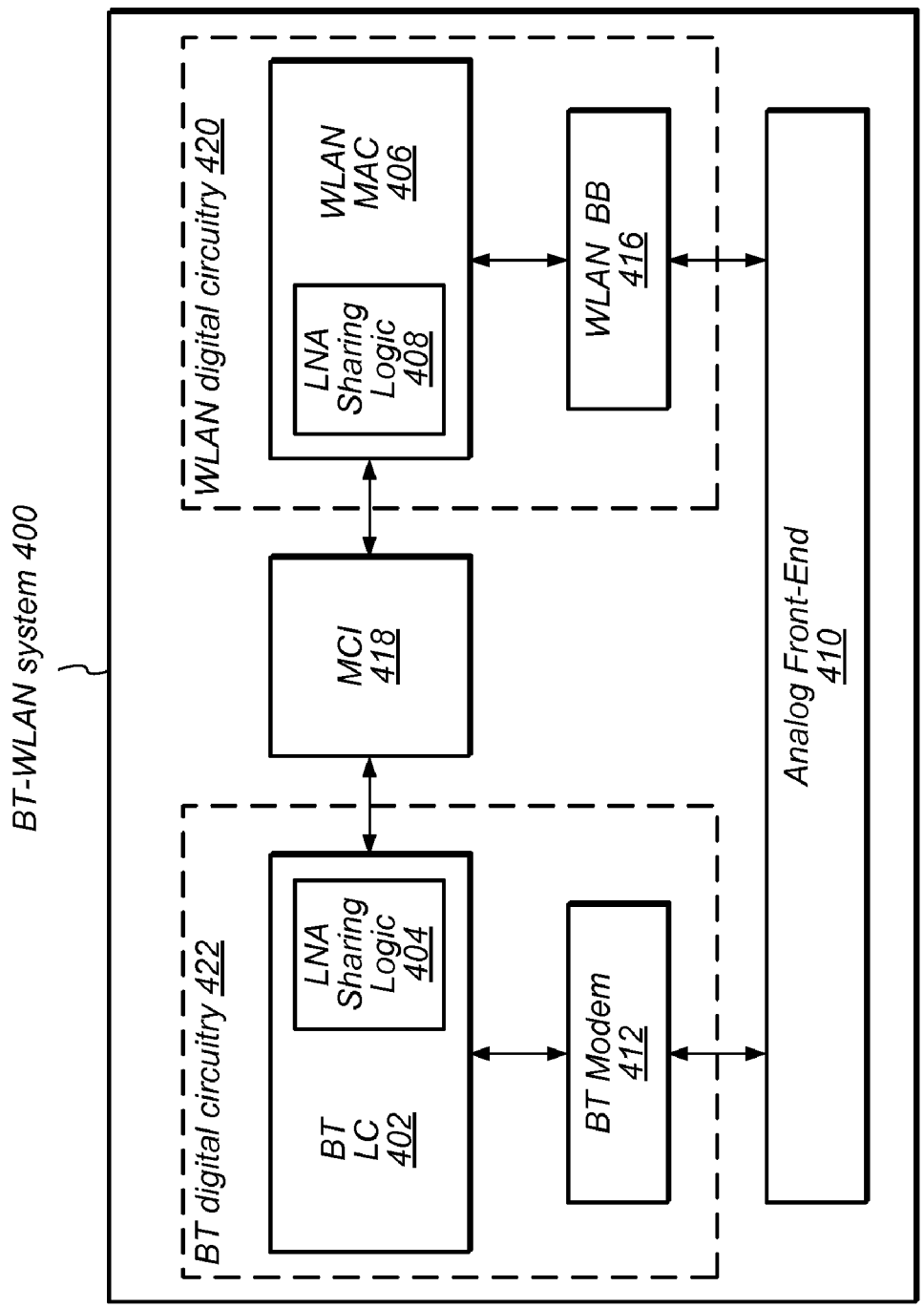
FIG. 4 is a block diagram illustrating a Bluetooth-WLAN implementation of a system supporting multiple wireless protocols for use in a wireless device according to one embodiment.

FIGS. 3-4 illustrate portions of an exemplary embodiment of a system supporting multiple wireless protocols for use in a wireless device in which the first wireless protocol is WLAN and the second wireless protocol circuitry is Bluetooth. While these embodiments represent one possible implementation of the system and method described herein, as noted above, the first wireless protocol and the second wireless protocol may be any of various wireless protocols, as desired, according to various embodiments.

FIG. 3 illustrates an analog portion of a Bluetooth-WLAN implementation of a system 300 supporting multiple wireless protocols for use in a wireless device 100. As noted above, this exemplary embodiment is illustrative of one possible implementation of this disclosure, and is not intended to be limiting to the disclosure as a whole. Implementations directed to different wireless protocols are envisioned, as are implementations directed to different system architectures. Further description and examples of possible system architectures implementing a common gain element are provided in U.S. application Ser. No. 12/541,284 and U.S. application Ser. No. 12/323,338, which are incorporated by reference above. Numerous other possible variations and modifications will be apparent to those of skill in the art having the benefit of this disclosure, and should be considered within the scope of this disclosure.

As shown, the system 300 may include a coupling 308 for receiving/sending signals (e.g., from/to an antenna such as antenna 310). When signals are being received, the signals may be passed to the common gain element 306. As shown, the common gain element 306 may be a low noise amplifier (LNA). The gain setting of the LNA 306 may be controlled by the common automatic gain control (AGC) logic 316, which may be controlled by either the Bluetooth (BT) AGC 314 or the WLAN AGC 312 depending on the circumstances. The mechanism for determining whether the Bluetooth AGC 314 or the WLAN AGC 312 controls the gain setting of the common gain element 306 may be any of a variety of mechanisms; one exemplary mechanism is described below with respect to FIG. 8. The LNA 306 may amplify the received signals according to its gain setting, after which the signals may be split out to the Bluetooth circuitry 304 and the WLAN circuitry 302. It should be noted that while the LNA 306 is shown as being located within the WLAN circuitry 302, and may in some embodiments be physically located in closer proximity to the WLAN circuitry 302 than to the Bluetooth circuitry 304, LNA 306 may logically be common to both the Bluetooth circuitry 304 and the WLAN circuitry 302.

After being out split to the Bluetooth circuitry 304 and the WLAN circuitry 302, the received signals may be processed by the respective circuitries. This may include one or more analog processing steps by various analog components of the respective circuitries 302, 304, such as downconversion to a baseband signal (e.g., using oscillators and mixers, as shown) and/or further gain control (e.g., using one or more amplifiers, as shown, to account for differences in strength between Bluetooth components of received signals and WLAN components of received signals). Various alternative or additional analog components and/or analog processing steps are also contemplated. Following any such analog processing, the received signals may be converted to digital signals by each circuitry's respective analog-to-digital converter and passed to digital portions 320, 322 of the respective circuitries 302, 304 for processing according to the respective protocols.

It should be noted that in some embodiments, one or both of the wireless protocol circuitries may include multiple receive/transmit paths. For example, as shown, the WLAN might have multiple receive/transmit paths corresponding to different bandwidths on which the WLAN can operate. Thus, the WLAN circuitry might include one transmit/receive path for the 2.4 GHz range, and one transmit/receive path for the 5 GHz range. In this case, the common gain element 306 may be common to the 2.4 GHZ path of the WLAN and to the Bluetooth (which may also operate at 2.4 GHz), while the 5 GHz path of the WLAN may not share any elements with the Bluetooth path. As another example, the WLAN may include multiple transmit/receive paths operating in the same frequency band (to support MIMO). In this case, only one chain may share the LNA 306, and the other chain(s) may not share the LNA 306.

In some embodiments, the analog front-end shown in FIG. 3 may be used as part of a system such as shown in FIG. 4 and described below with respect thereto; however, according to various embodiments, the analog front-end shown in FIG. 3 may alternatively be used with any of various overall system architectures.

FIG. 4 is a block diagram illustrating an exemplary embodiment of a system supporting multiple wireless protocols for use in a wireless device, in which the wireless protocols are Bluetooth and WLAN. The system 400 shown utilizes a combination of digital logic (Bluetooth Link Control (LC) 402, Bluetooth (BT) Modem 412, WLAN Medium Access Control (MAC) 406, WLAN Baseband (BB) 416) and analog front-end 410. In addition, one or both of the WLAN and BT digital portions 420, 422 may further include higher (e.g., software) levels of logic for further processing of signals and/or performing other functions. Although the system shown in FIG. 4 represents one possible implementation of a system supporting multiple wireless protocols for use in a wireless device, it should be noted that any number of variations and alternate embodiments are also possible and are contemplated.

The analog front-end 410 may be configured to receive signals (e.g., via an input, from an antenna) having both components according to the Bluetooth protocol and according to the WLAN protocol. The analog front-end 410 may at least include a "common" gain element, e.g., a gain element to which both the Bluetooth circuitry and the WLAN circuitry may be coupled. In this way, received signals may be amplified before being split out to the respective circuitries, such that the respective circuitries may simultaneously receive and process the signals each according to its respective protocol. According to some embodiments, the system of FIG. 4 may be implemented with an analog front-end 410 such as shown in FIG. 3 and described above with respect thereto; however, the system of FIG. 4 may be implemented with an analog front-end 410 having a different architecture, if desired. The Bluetooth and WLAN portions of the analog front-end may each convert the analog-processed signals to digital signals and pass those signals to the Bluetooth Modem 412 and the WLAN BB 416 respectively.

The WLAN digital circuitry 420 may include baseband (BB) logic 416 and Medium Access Control (MAC) logic 406. Similarly, the Bluetooth digital circuitry 422 may include Modem logic 412 and Link Control (LC) logic 402. As noted above, in some embodiments, the WLAN and BT digital portions 420, 422 may further include higher (e.g., software) levels of logic for further processing of signals and/or performing other functions.

As shown, the system 400 may include a communication interface, e.g., the Message Control Interface (MCI) 418, with which Bluetooth and WLAN may communicate. By passing MCI messages to each other according to a method for sharing control on a common gain element, the Bluetooth LC layer 402 (e.g., gain element sharing logic 404 in the Bluetooth LC layer 402) and the WLAN MAC layer (e.g., gain element sharing logic 408 in the WLAN MAC layer 406) may be able to cooperatively and efficiently transfer control of the common gain element back and forth. FIGS. 5-7 are flowchart diagrams illustrating embodiments of such a method for two wireless protocol circuitries (such as WLAN and Bluetooth) to share control of a common gain element.

FIGS. 5-7 are flowchart diagrams illustrating embodiments of a method for transferring control of a common gain element between multiple wireless protocol circuitries. The method may be implemented in a system supporting multiple wireless protocols for use in a wireless device, such as any of the systems shown in the various figures and described with respect thereto. For example, embodiments are contemplated in which the multiple wireless protocol circuitries include first wireless protocol circuitry 202 and second wireless protocol circuitry 204. In some embodiments (such as might be implemented in the systems shown in FIGS. 3 and 4 and described above with respect thereto), the wireless protocols may be WLAN and Bluetooth (BT). The wireless protocols may alternatively be other wireless protocols, if desired.

The method enables the first and second wireless protocol circuitries 202, 204 to efficiently and effectively share control of the common gain element, so that both the first wireless protocol circuitry 202 and the second wireless protocol circuitry 204 are able to effectively receive and make use of signals received by the system simultaneously. If only one of the first wireless protocol circuitry 202 or the second wireless protocol circuitry 204 is receiving signals at a particular time, it may be desirable for the receiving wireless protocol circuitry to control the common gain element. On the other hand, if both of the wireless protocol circuitries are attempting to receive signals simultaneously, it may be desirable for one of the wireless protocol circuitries to control the common gain element on behalf of both of the wireless protocol circuitries. Accordingly, the method may provide for one of the wireless protocol circuitries to be the "default" controller of the common gain element. For the purposes of this disclosure, the wireless protocol circuitry referred to as the first wireless protocol circuitry 202 may be considered as the "default" controller of the common gain element. The method described below with respect to FIGS. 5-7 is intended to provide a framework within which each wireless protocol circuitry may effectively determine when the other wireless protocol circuitry is active, and take control, transfer control, or maintain control (or non-control) of the common gain element, as appropriate.

While the steps described below with respect to FIGS. 5-7 are shown in a certain order, it should be noted that, according to various embodiments, one or more of the steps may be omitted, repeated, or performed in a different order than shown. One or more additional steps may also or alternatively be added, as desired.

Figure 5A:
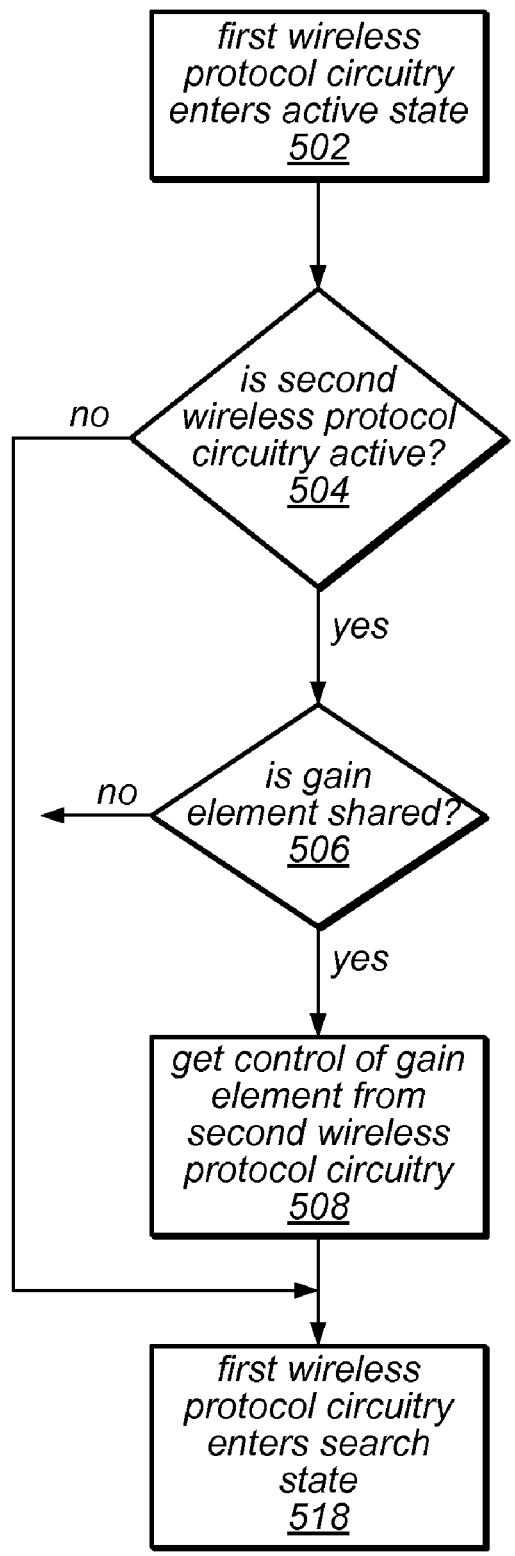
FIGS. 5-7 are flowchart diagrams illustrating embodiments of a method for transferring control of a common gain element in a system supporting multiple wireless protocols for use in a wireless device.

FIG. 5A is a flowchart illustrating steps the first wireless protocol circuitry 202 may take upon entering (e.g., in response to entering) an active state. Thus, at step 502, the first wireless protocol circuitry 202 may enter an active state. Entering an active state may include resuming operation after being in a power-saving (e.g., sleep) mode in which no reception occurs, or may include beginning operation after being powered off.

At step 504, the first wireless protocol circuitry 202 may determine whether the second wireless protocol circuitry 204 is active. If the second wireless protocol circuitry 204 is not active (e.g., if the second wireless protocol circuitry 204 is sleeping or powered down) (step 504-no), there may be no need to inform the second wireless protocol circuitry 204 that the first protocol circuitry is taking control of the common gain element, and the first wireless protocol circuitry 202 may simply take control of the common gain element. Controlling the common gain element may include controlling a gain setting of the common gain element, e.g., via the first wireless protocol circuitry 202's automatic gain control logic.

At step 506, if the second wireless protocol circuitry 204 is active (step 504-yes), the first wireless protocol circuitry 202 may determine whether the common gain element 306 is currently shared. In one embodiment of 506, the method determines if the logic is operated in a 2 antenna or 3 antenna configuration. In the 3 antenna configuration, Bluetooth and WLAN use independent antennas and radio chains. In the 2 antenna configuration, one of the antennas and the LNA 306 connected to this antenna are shared between Bluetooth and WLAN. Thus in 506 the method may determine whether the common gain element 306 is shared (2 antenna configuration) or not shared (3 antenna configuration).

It should be noted that although the common gain element may be coupled to both the first wireless protocol circuitry 202 and the second wireless protocol circuitry 204, in one embodiment the phrase "currently shared" as applied to the common gain element in this context may refer more specifically to a case when both the first wireless protocol circuitry 202 and second wireless protocol circuitry 204 are receiving signals via receive paths that include the gain element 206 at a current time. Thus, there may be several circumstances in which the second wireless protocol circuitry 204 may be active but the common gain element would not be "shared". For example, if the second wireless protocol circuitry 204 is transmitting signals, or is idle (e.g., neither transmitting nor receiving), or is preparing to enter an inactive state (e.g., sleep or power-down), the second wireless protocol circuitry 204 may not be using the common gain element 206. If the common gain element 206 is not currently shared, there may be no need to inform the second wireless protocol circuitry 204 that the first protocol circuitry is taking control of the common gain element 206, similar to the case when the second wireless protocol circuitry 204 is inactive. Thus, in this case, the first wireless protocol circuitry 202 may also simply begin controlling the common gain element 206 without informing the second wireless protocol circuitry 204.

At step 508, if the first wireless protocol circuitry 202 determines that the second wireless protocol circuitry 204 is active and the common gain element 206 is currently shared (step 506-yes), the first wireless protocol circuitry 202 may take control of the common gain element 206 from the second wireless protocol circuitry 204.

Figure 5B:
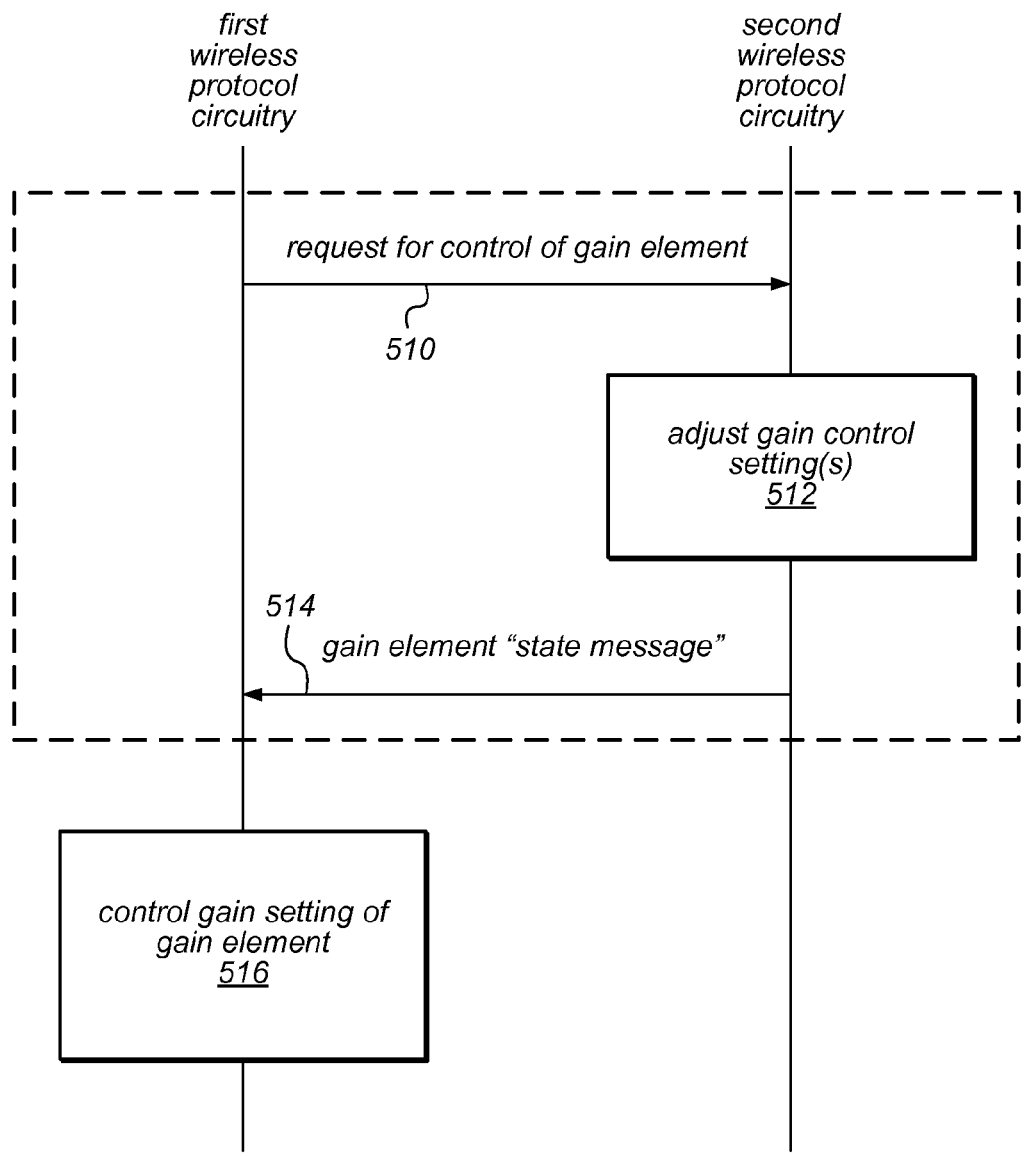

FIG. 5B illustrates one possible series of steps that the first wireless protocol circuitry 202 could make in taking control of the common gain element 206 from the second wireless protocol circuitry 204. Turning to FIG. 5B, at step 510, the first wireless protocol circuitry 202 may send a request (e.g., using a communication interface, such as the MCI interface in a WLAN-Bluetooth implementation) to the second wireless protocol circuitry 204 that control of the shared gain element 206 be transferred from the second wireless protocol circuitry 204 to the first wireless protocol circuitry 202. At step 514, in response to receiving the request, the second wireless protocol circuitry 204 may send a "state message" indicating the state of the common gain element 206. The state message may be a simple acknowledgement to the first wireless protocol circuitry 202 that the second wireless protocol circuitry 204 is relinquishing control of the common gain element 206, or may include additional information, and/or may be selected from a variety of possible state messages corresponding to different situations. For example, the second wireless protocol circuitry 204 may be configured to send a state message indicating that control of the common gain element cannot or should not be transferred at a particular time, under some circumstances. In this case, the first wireless protocol circuitry 202 may continue (e.g., on a regular/periodic basis) to request control of the common gain element from the second wireless protocol circuitry 204, or may simply wait for the second wireless protocol circuitry 204 to send another state message acknowledging that the first wireless protocol circuitry 202 may begin controlling the common gain element. Table 1 is provided below to illustrate a variety of conditions under which the second wireless protocol circuitry 204 might send a variety of state messages (or might not send a state message) to the first wireless protocol circuitry 202 according to one exemplary embodiment.

TABLE 1

| Second wireless protocol circuitry state | State Message | | |
|---|---|---|---|
| | In use | Gain element locked | Gain setting |
| Radio calibration | Delay transfer of control of the common gain element to first wireless protocol circuitry | | |
| Asleep | First wireless protocol circuitry takes control of the common gain element without waiting for state message | | |
| Idle | 0 | 0 | X |
| Transmit | 0 | 0 | X |
| Search | 1 | 0 | Current gain setting |
| Receive (access code found) | 1 | 1 | Current gain setting |

As shown, in the exemplary embodiment illustrated by Table 1, the second wireless protocol circuitry 204 may in any of radio calibration, asleep, idle, transmit, search, or receive states when the request is received. Other sets of possible states are also contemplated.

As shown, in some embodiments, if the second wireless protocol circuitry 204 is performing radio calibration (e.g., calibrating the analog portion of the second wireless protocol circuitry 204), the second wireless protocol circuitry 204 may delay transfer of control of the common gain element to the first wireless protocol circuitry 202. Although this may introduce some latency, in many embodiments radio calibration may be performed relatively infrequently, e.g., only once each time the second wireless protocol circuitry 204 is powered on. Thus if the second wireless protocol circuitry 204 is performing radio calibration, it may be desirable to allow the second wireless protocol circuitry 204 to finish before transferring control of the common gain element. In some embodiments, this may be accomplished by the second wireless protocol circuitry 204 waiting until a subsequent state is entered, and then sending a state message upon entering the subsequent state. Alternatively, the second wireless protocol circuitry 204 may ignore the request while in the radio calibration state, and may send a state message only in response to a request received while in a different state (e.g., a repeated request by the first wireless protocol circuitry 202) in response to a request received while in a different state. Other ways of cooperatively allowing the second wireless protocol circuitry 204 to finish radio calibration before transferring control of the common gain element are also contemplated. In addition, embodiments are contemplated in which the second wireless protocol circuitry 204 is configured to transfer control of the common gain element while performing radio calibration (e.g., interrupting the calibration), for example, to avoid the latency that delaying the transfer may cause.

In some embodiments, if the second wireless protocol circuitry 204 is asleep, no state message may be sent. As noted above with respect to step 504, if the second wireless protocol circuitry 204 is asleep, the first wireless protocol circuitry 202 may simply begin controlling the common gain element without consulting the second wireless protocol circuitry 204; in other words, if the second wireless protocol circuitry 204 is asleep, the first wireless protocol circuitry 202 may not send a request that control of the shared gain element be transferred from the second wireless protocol circuitry 204 to the first wireless protocol circuitry 202, and/or the second wireless protocol circuitry 204 may not receive such a request.

In some embodiments, if the second wireless protocol circuitry 204 is idle or transmitting, the common gain element may not be currently shared. For example, if the gain element is common to the receive path, and the second wireless protocol circuitry 204 is not receiving signals or searching for signals, the second wireless protocol circuitry 204 may not be actively controlling the common gain element, so it may be possible for the first wireless protocol circuitry 202 to simply begin controlling the common gain element, e.g., as described above with respect to step 506.

In some embodiments, if the second wireless protocol circuitry 204 is in a search state (e.g., searching for signals it should receive) or in a receive state (e.g., once the second wireless protocol circuitry 204 has found an access code and is actively receiving signals), it may be appropriate for the second wireless protocol circuitry 204 to transfer control of the common gain element to the first wireless protocol circuitry 202, however, it is also possible that the common gain element may be in use (e.g., the second wireless protocol circuitry 204 may be actively adjusting the gain) or the gain may be locked. In these circumstances, the state message may indicate to the first wireless protocol circuitry 202 the current situation. If the gain of the common gain element is not locked, the state message may indicate the current gain setting of the common gain element. The first wireless protocol circuitry 202 may use the information in the state message in taking control of the common gain element, for example, to determine an initial gain setting of the common gain element (e.g., to ensure a smooth transition).

As part of transferring control of the common gain element, it may be desirable for the second wireless protocol circuitry 204 to adjust its gain control setting(s). The receive path of the second wireless protocol circuitry 204 may include one or more gain elements in addition to (e.g., after) the common gain element. In some embodiments, the second wireless protocol circuitry 204 may be configured to perform automatic gain control (e.g., a feedback mechanism to ensure that signal strength is at an appropriate level for processing) using such gain elements. Thus in some embodiments, at step 512, the second wireless protocol circuitry 204 may adjust one or more gain control settings (e.g., its automatic gain control) depending on whether the second wireless protocol circuitry 204 is controlling the common gain element.

As an example, the second wireless protocol circuitry 204 might be configured to use first gain control settings (a "fat" gain table) when it controls both the common gain element and any gain elements in the second wireless protocol circuitry 204, and to use second gain control settings (a "lean" gain table) when it controls only the gain elements in the second wireless protocol circuitry 204 and does not control the common gain element. In one embodiment, in order to make a smooth transition from the fat gain table to the lean gain table, transitioning from the fat gain table to the lean gain table may include setting the gain index of the lean gain table initially to the current value of the fat gain table index minus an offset corresponding to the current gain setting of the common gain element.

Once the first wireless protocol circuitry 202 has received an acknowledgement (e.g., a state message acknowledging that the first wireless protocol circuitry 202 is taking control of the gain element from the second wireless protocol circuitry 204) from the second wireless protocol circuitry 204, the first wireless protocol circuitry 202 may begin controlling the gain element. As indicated in step 516, this may include controlling a gain setting of the gain element.

Once the first wireless protocol circuitry 202 has acquired control of the common gain element, the first wireless protocol circuitry 202 may proceed with other signal-reception related operations. For example, in many embodiments, the first wireless protocol circuitry 202 may enter a search state, e.g., to search for signals which are intended for the first wireless protocol circuitry 202, as indicated in step 518 in FIG. 5A.

An additional consideration should also be noted. It is possible that in some embodiments, the first wireless protocol circuitry 202 may frequently transition between an inactive state and an active state, leading to transfer of control of the common gain element occurring frequently enough so as to be problematic. For example, if according to the first wireless protocol the first wireless protocol circuitry 202 must check for signals at a certain frequency, the first wireless protocol circuitry 202 may need to wake-up, check for signals, and (if there are no signals to receive) return to an inactive state at that frequency. Each transition from inactivity to activity and vice-versa may result in a transfer of control of the gain element. In this case, it may be desirable for the first wireless protocol circuitry 202 to use a different receive path on some occasions.

As one example, as described above with respect to FIG. 3, WLAN may in some cases have multiple receive paths. If one path does not use the common gain element, it may be possible to use that path on some occasions (e.g., to check for beacons) in order to reduce the frequency at which transfers of control of the common gain element occur.

While this potentiality should be considered, it is worth noting that in many embodiments, there may be no such problem with overly-frequent transfers of control.

Figure 6A:
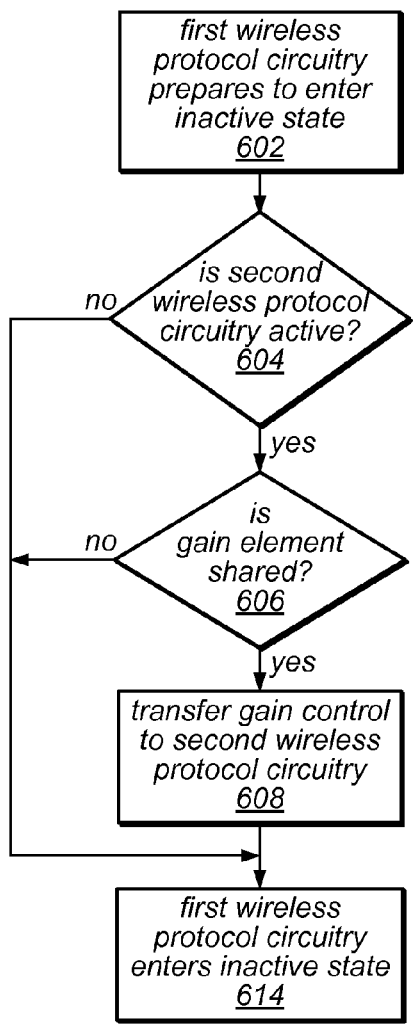
Figure 7:
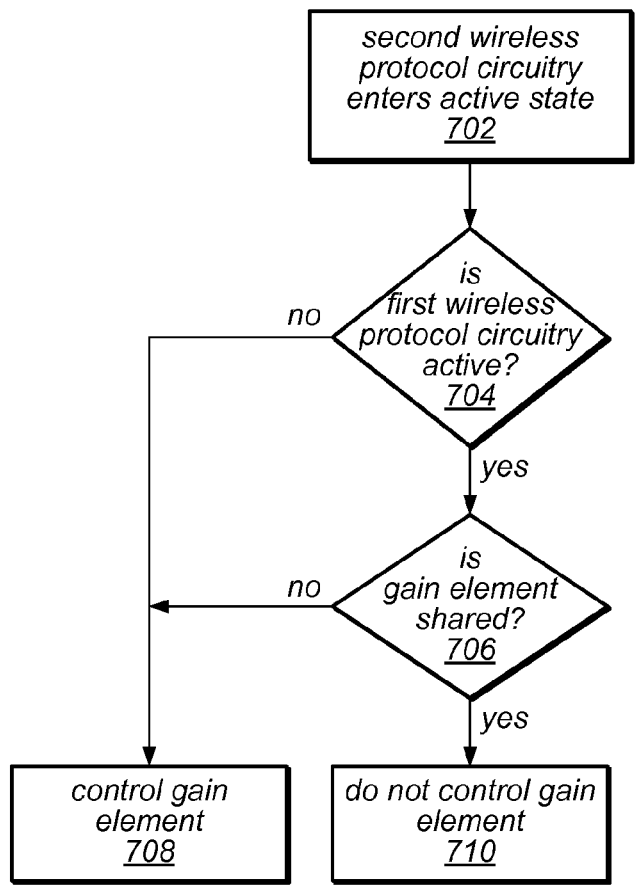

FIG. 6A is a flowchart illustrating steps the first wireless protocol circuitry 202 may take upon preparing to enter (e.g., in response to preparing to enter) an inactive state. Thus, as step 602, the first wireless protocol circuitry 202 may prepare to enter an inactive state. Entering an inactive state may include entering a power-saving (e.g., sleep) mode in which no reception occurs, or may include being powered off.

At step 604, the first wireless protocol circuitry 202 may determine whether the second wireless protocol circuitry 204 is active. If the second wireless protocol circuitry 204 is not active (e.g., if the second wireless protocol circuitry 204 is sleeping or powered down) (step 604-no), there may be no need to transfer control of the common gain element, and the first wireless protocol circuitry 202 may simply enter the inactive state (step 614).

At step 606, if the second wireless protocol circuitry 204 is active, the first wireless protocol circuitry 202 may determine whether the common gain element is currently shared. As described above, there are several circumstances in which the second wireless protocol circuitry 204 may be active but the common gain element would not be shared at a particular time. If the common gain element is not currently shared (step 606-no), there may be no need to transfer control of the common gain element, similar to the case when the second wireless protocol circuitry 204 is inactive. Thus, in this case, the first wireless protocol circuitry 202 may again simply enter the inactive state (step 614).

Figure 6B:
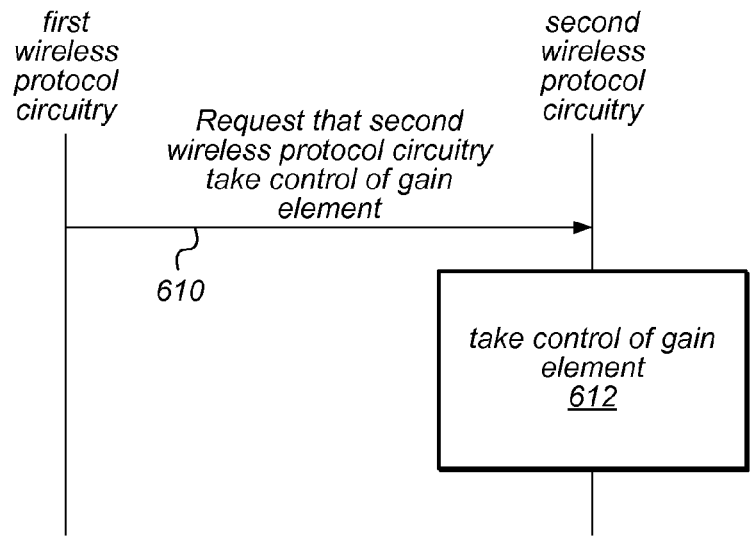

At step 608, if the first wireless protocol circuitry 202 determines that the second wireless protocol circuitry 204 is active and the common gain element is currently shared (step 606-yes), the first wireless protocol circuitry 202 may transfer control of the common gain element to the second wireless protocol circuitry 204. FIG. 6B illustrates one possible series of steps that transferring control of the common gain element to the second wireless protocol circuitry 204 could include.

At step 610, the first wireless protocol circuitry 202 may send a request (e.g., using a communication interface, such as the MCI interface in a WLAN-Bluetooth implementation) to the second wireless protocol circuitry 204 that the second wireless protocol circuitry 204 take control of the shared gain element from the first wireless protocol circuitry 202.

At step 612, the second wireless protocol circuitry 204 may take control of the common gain element. For example, the second wireless protocol circuitry 204 may begin controlling the gain setting of the common gain element in response to receiving the request that the second wireless protocol circuitry 204 take control of the shared gain element from the first wireless protocol circuitry 202. This may include adjusting one or more gain control settings of the second wireless protocol circuitry 204, e.g., transitioning from a lean gain table to a fat gain table.

At step 614, having transferred control of the common gain element to the second wireless protocol circuitry 204 or having determined that transferring control of the common gain element to the second wireless protocol circuitry 204 is not necessary, the first wireless protocol circuitry 202 may enter the inactive state.

FIG. 7 is a flowchart illustrating steps the second wireless protocol circuitry 204 may take upon entering (e.g., in response to entering) an active state. Thus, at step 702, the second wireless protocol circuitry 204 may enter an active state. Similar to the first wireless protocol circuitry 202, the second wireless protocol circuitry 204 entering an active state may include resuming operation after being in a power-saving (e.g., sleep) mode in which no reception occurs, or may include beginning operation after being powered off.

At step 704, the second wireless protocol circuitry 204 may determine whether the first wireless protocol circuitry 202 is active. If the first wireless protocol circuitry 202 is not active (e.g., if the first wireless protocol circuitry 202 is sleeping or powered down), the first wireless protocol circuitry 202 may not be controlling the common gain element, and so it may be desirable for the second wireless protocol circuitry 204 to take control of the common gain element, and the second wireless protocol circuitry 204 may do so in step 708, as will be described below.

At step 706, if the first wireless protocol circuitry 202 is active, the second wireless protocol circuitry 204 may determine whether the common gain element is currently shared. If the common gain element is not currently shared (step 706-no), it may be desirable for the second wireless protocol circuitry 204 to take control of the common gain element. Thus, similar to the case when the first wireless protocol circuitry 202 is inactive, the second wireless protocol circuitry 204 may take control of the common gain element (step 708).

In step 708, if the second wireless protocol circuitry 204 determines that the first wireless protocol circuitry 202 is not active or the common gain element is not currently shared, the second wireless protocol circuitry 204 may take control of the common gain element. As previously described, controlling the common gain element may include controlling a gain setting of the common gain element, e.g., via the first wireless protocol circuitry 202's automatic gain control logic. This may also include setting one or more automatic gain control settings (e.g., a fat gain table) such as to account for the second wireless protocol circuitry 204 controlling the common gain element.

Figure 8:
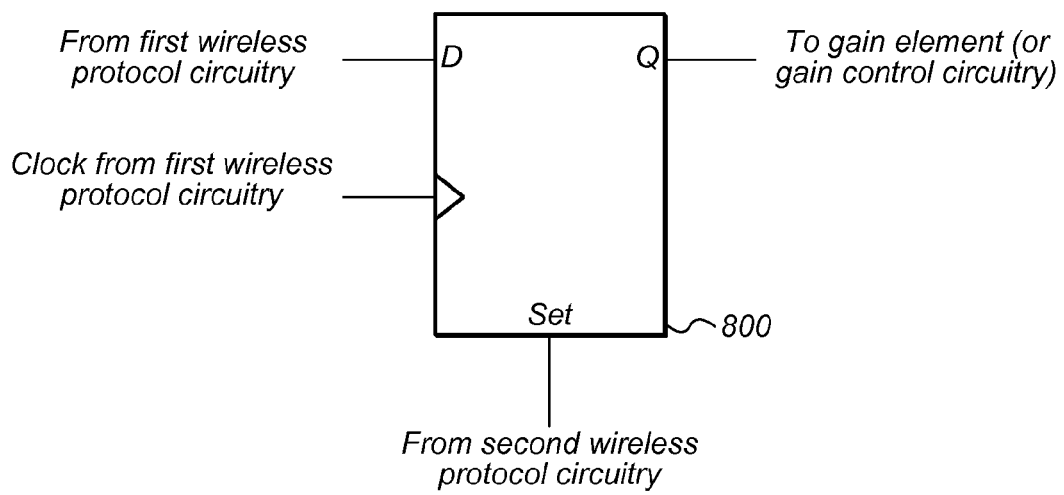
FIG. 8 is a block diagram illustrating a control sharing mechanism for a common gain according to one embodiment.

In step 710, if the second wireless protocol circuitry 204 determines that the first wireless protocol circuitry 202 is active and the common gain element is currently shared (step 706-yes), the second wireless protocol circuitry 204 may not take control of the common gain element. Instead, the second wireless protocol circuitry 204 may set its gain control setting(s) (e.g., a lean gain table) such as to account for the second wireless protocol circuitry 204 not controlling the common gain element FIG. 8 is a block diagram illustrating an embodiment of one possible mechanism for sharing of control of a gain element. As shown, there may be a D flip-flop 800 with a D input from the first wireless protocol circuitry, a clock input from the first wireless protocol circuitry, and a Set input from the second wireless protocol circuitry. These inputs may effectively provide an output signal to the gain element (or gain control circuitry controlling the gain element) determining whether the gain element is controlled by the first wireless protocol circuitry or the second wireless protocol circuitry. In one embodiment, flip-flop 800 might reside in the common AGC 316 shown in FIG. 3.

As an example, the first wireless protocol circuitry might be configured to set the D input as a logic "0" value when the first wireless protocol circuitry is controlling the gain element. When the second wireless protocol circuitry is controlling the gain element (e.g., when the first wireless protocol circuitry is inactive), the second wireless protocol circuitry might be configured to set the Set input as a logic "1" value. In this way, the gain element (or gain control circuitry controlling the gain element) may receive a logic "1" value if the second wireless protocol circuitry is to control the gain element, and may receive a logic "0" value if the first wireless protocol circuitry is to control the gain element. It will be noted that although the control-sharing mechanism shown in FIG. 8 represents one exemplary means for reliably controlling which circuitry controls the gain element, variations and alternatives to this particular means are also envisioned.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for use in a wireless device, the system comprising:
   a gain element coupled to receive a first and second signals, wherein the gain element is adjustable to amplify the received first and second signals by an adjustable amount;
   first wireless protocol circuitry coupled to the gain element, wherein the first wireless protocol circuitry is configured to receive and process the first signals according to a first wireless protocol;
   second wireless protocol circuitry coupled to the gain element, wherein the second wireless protocol circuitry is configured to receive and process the second signals according to a second wireless protocol; and
   wherein the first wireless protocol circuitry is configured to:
   determine whether the second wireless protocol circuitry is active;
   determine whether the gain element is currently shared; and
   in response to determining that the second wireless protocol circuitry is active and the gain element is currently shared, take control of the gain element from the second wireless protocol circuitry.

2. The system of claim 1, wherein the first wireless protocol circuitry is further configured to:

receive, from the second wireless protocol circuitry, an indication of a current gain setting of the gain element; and control a gain setting of the gain element based on the current gain setting of the gain element.

3. The system of claim 1, wherein the first wireless protocol circuitry is further configured to: send a request for control of the gain element to the second wireless protocol circuitry; and receive an acknowledgement that the first wireless protocol circuitry is taking control of the gain element from the second wireless protocol circuitry.

4. The system of claim 1, wherein the second wireless protocol circuitry is configured to:

receive a request for control of the gain element from the first wireless protocol circuitry; and send, in response to receiving a request for control of the gain element from the first wireless protocol circuitry, an acknowledgement that the first wireless protocol circuitry is taking control of the gain element to the first wireless protocol circuitry.

5. The system of claim 1, wherein the second wireless protocol circuitry is configured to adjust one or more gain control settings of the second wireless protocol circuitry in response to the second wireless protocol circuitry no longer controlling the gain element.

6. The system of claim 1, wherein in response to determining that the second wireless protocol circuitry is inactive or the gain element is not currently shared, the first wireless protocol circuitry is configured to take control of the gain element without notifying the second wireless protocol circuitry.

7. The system of claim 1, wherein upon preparing to enter an inactive state, the first wireless protocol circuitry is configured to:

determine whether the second wireless protocol circuitry is active;

determine whether the gain element is currently shared; and in response to determining that the second wireless protocol circuitry is active and the gain element is currently shared, send a request that the second wireless protocol circuitry take control of the gain element to the second wireless protocol circuitry.

8. The system of claim 7, wherein in response to receiving a request that the second wireless protocol circuitry take control of the gain element from the first wireless protocol circuitry, the second wireless protocol circuitry is configured to control a gain setting of the gain element.

9. The system of claim 1, wherein the second wireless protocol circuitry is configured to:

determine whether the first wireless protocol circuitry is active;

determine whether the gain element is currently shared;

in response to determining that the first wireless protocol circuitry is inactive or the gain element is not currently shared, control a gain setting of the gain element; and wherein the second wireless protocol circuitry is configured to not control the gain setting of the gain element in response to determining that the first wireless protocol circuitry is active and the gain element is currently shared.

10. A method for operating a communication device, the communication device comprising a first wireless protocol circuitry and a second wireless protocol circuitry, the method comprising:

receiving input signals;

activating the first wireless protocol circuitry;

checking whether the second wireless protocol circuitry is active;

determining whether a gain element common to the first and second wireless protocol circuitry is shared; and providing control of the gain element to the first wireless protocol circuitry in the event the second wireless protocol is active and the gain element is currently shared.

11. The method of claim 10, wherein said providing control of the gain element to the first wireless protocol circuitry comprises:

receiving, by the first wireless protocol circuitry, an indication of a current gain setting of the gain element; and controlling, by the first wireless protocol circuitry, a gain setting of the gain element based on the current gain setting of the gain element.

12. The method of claim 10, further comprising:

sending, by the first wireless protocol circuitry, a request for control of the gain element;

receiving, by the first wireless protocol circuitry, an acknowledgement of the request for control of the gain element.

13. The method of claim 10, further comprising:

receiving, by the second wireless protocol circuitry, a request for control of the gain element;

sending, by the second wireless protocol circuitry, an acknowledgement of the request for control of the gain element, wherein said ending an acknowledgement is performed in response to receiving the request for control of the gain element.

14. The method of claim 10, wherein providing control of the gain element to the first wireless protocol circuitry comprises the second wireless protocol circuitry no longer controlling the gain element, the method further comprising:

adjusting, by the second wireless protocol circuitry, one or more gain control settings of the second wireless protocol circuitry in response to the second wireless protocol circuitry no longer controlling the gain element.

15. The method of claim 10, further comprising:

preparing to deactivate the first wireless protocol circuitry;

in response to preparing to deactivate the first wireless protocol circuitry:

checking whether the second wireless protocol circuitry is active;

determining whether the gain element is currently shared; and providing control of the gain element to the second wireless protocol circuitry in the event the second wireless protocol is active and the gain element is currently shared.

16. The method of claim 15, further comprising:

controlling, by the second wireless protocol circuitry, a gain setting of the gain element in response to said providing control of the gain element to the second wireless protocol circuitry.

17. The method of claim 10, further comprising:

activating the second wireless protocol circuitry;

in response to activating the second wireless protocol circuitry:

checking whether the first wireless protocol circuitry is active;

determining whether the gain element is currently shared; and providing control of the gain element to the second wireless protocol circuitry in the event the first wireless protocol circuitry is inactive or the gain element is not currently shared;

wherein control of the gain element is not provided to the second wireless protocol circuitry in the event the first wireless protocol circuitry is active and the gain element is currently shared.

18. The method of claim 17, further comprising controlling, by the second wireless protocol circuitry, a gain setting of the gain element in response to said providing control of the gain element to the second wireless protocol circuitry.

19. A method for operating a communication device, wherein the communication device comprises first wireless protocol circuitry and second wireless protocol circuitry, the method comprising:

the first wireless protocol circuitry entering an active state;

in response to the first wireless protocol circuitry entering an active state:

the first wireless protocol circuitry determining whether the second wireless protocol circuitry is active;

the first wireless protocol circuitry determining whether a gain element is currently shared, wherein the first wireless protocol circuitry and the second wireless protocol circuitry are each coupled to the gain element, wherein the gain element is adjustable to amplify signals by an adjustable amount;

the first wireless protocol circuitry taking control of the gain element from the second wireless protocol circuitry in response to determining that the second wireless protocol circuitry is active and the gain element is currently shared.

20. The method of claim 19, wherein the first wireless protocol circuitry taking control of the gain comprises:

receiving, from the second wireless protocol circuitry, an indication of a current gain setting of the gain element; and controlling a gain setting of the gain element based on the current gain setting of the gain element.

* * * * *